(12) United States Patent
Kashiwaya et al.

(10) Patent No.: US 8,878,070 B2
(45) Date of Patent: Nov. 4, 2014

(54) WIRING BOARD AND METHOD OF MANUFACTURING A SEMICONDUCTOR DEVICE

(75) Inventors: Emi Kashiwaya, Tokyo (JP); Osamu Kindo, Tokyo (JP); Noriou Shimada, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 340 days.

(21) Appl. No.: 13/222,542

(22) Filed: Aug. 31, 2011

(65) Prior Publication Data

US 2012/0048595 A1 Mar. 1, 2012

(30) Foreign Application Priority Data

Sep. 1, 2010 (JP) ................................. 2010-195652

(51) Int. Cl.
| | |
|---|---|
| H05K 1/00 | (2006.01) |
| H01L 23/31 | (2006.01) |
| H01L 21/56 | (2006.01) |
| H05K 3/00 | (2006.01) |
| H05K 3/28 | (2006.01) |
| H01L 23/00 | (2006.01) |
| H05K 1/02 | (2006.01) |
| H05K 3/40 | (2006.01) |
| H01L 23/498 | (2006.01) |

(52) U.S. Cl.
CPC .............. *H05K 3/284* (2013.01); *H01L 24/48* (2013.01); *H05K 2203/1316* (2013.01); *H01L 2924/01005* (2013.01); *H05K 1/0271* (2013.01); *H01L 2224/48227* (2013.01); *H05K 3/4015* (2013.01); *H01L 23/3142* (2013.01); *H01L 2924/014* (2013.01); *H01L 21/561* (2013.01); *H01L 2924/01079* (2013.01); *H01L 2203/041* (2013.01); *H05K 3/0097* (2013.01); *H01L 21/565* (2013.01); *H01L 2224/97* (2013.01); *H01L 2924/01029* (2013.01); *H01L 24/97* (2013.01); *H01L 2924/01033* (2013.01); *H01L 2924/01006* (2013.01); *H01L 23/49838* (2013.01); *H01L 2224/48225* (2013.01); *H01L 2224/48091* (2013.01)
USPC ........... 174/250; 174/254; 174/256; 174/260; 174/261; 174/262; 257/778; 257/784; 257/786; 257/787; 257/295; 361/760

(58) Field of Classification Search
USPC .......... 174/250, 254, 260; 257/778, 784, 786; 361/760
See application file for complete search history.

(56) References Cited

U.S. PATENT DOCUMENTS

| | | |
|---|---|---|
| 6,538,317 B1 | 3/2003 | Miyata |
| 6,573,612 B1 | 6/2003 | Miyata |

(Continued)

FOREIGN PATENT DOCUMENTS

| | | |
|---|---|---|
| JP | 2001-44229 A | 2/2001 |
| JP | 2001-44324 A | 2/2001 |

*Primary Examiner* — Timothy Thompson
*Assistant Examiner* — Paresh Paghadal
(74) *Attorney, Agent, or Firm* — Foley & Lardner LLP

(57) ABSTRACT

A wiring board of this invention includes a product formation area in which are arranged a plurality of product formation sections on which a semiconductor chip is mounted; a molding area that is provided on an outer circumferential side of the product formation area, and with which a seal portion that covers the semiconductor chips mounted on the product formation sections makes contact; a clamp area that is provided on an outer circumferential side of the molding area, and that is held by a molding die that forms the seal portion; wiring that is provided in the product formation area, and that is electrically connected to the semiconductor chips; a first solid pattern that is provided in the molding area, and in which a plurality of dots are arranged; and a second solid pattern that is provided in the clamp area, and in which a plurality of dots that are larger than the dots of the first solid pattern are arranged.

18 Claims, 7 Drawing Sheets

(56) References Cited

U.S. PATENT DOCUMENTS

| | | | |
|---|---|---|---|
| 2010/0117202 A1* | 5/2010 | Eu et al. | 257/622 |
| 2010/0132993 A1* | 6/2010 | Nakamura et al. | 174/260 |
| 2010/0148350 A1* | 6/2010 | Shinohara et al. | 257/690 |

* cited by examiner (A-A)

WIRING BOARD AND METHOD OF MANUFACTURING A SEMICONDUCTOR DEVICE

This application is based on Japanese patent application no. JP 2010-195652, filed Sep. 1, 2010, the entire contents of which is incorporated herein by reference.

BACKGROUND OF THE INVENTION

1. Field of the Invention

The present invention relates to a wiring board on which semiconductor chips are mounted, and to a method of manufacturing a semiconductor device that uses the wiring board.

2. Description of the Related Art

Conventionally, a MAP (Mold Array Process) method is used as a method of manufacturing a BGA (Ball Grid Array) type semiconductor device. According to the MAP method, a semiconductor chip is mounted on each of a plurality of product formation sections defined on a wiring board, a sealing body that integrally covers the plurality of product formation sections is formed on the wiring board, and thereafter the wiring board is divided into respective product formation sections (for example, see JP2001-044324A or JP2001-044229A).

A wiring board has a product formation area in which a plurality of product formation sections on which semiconductor chips are mounted are arranged, and a molding area on which a sealing resin material is provided as a sealing body that covers the semiconductor chips mounted on the product formation area. A wiring pattern that is electrically connected to the semiconductor chips is formed in the product formation area. The molding area is arranged all along the circumference of the product formation area. The wiring board also has a clamp area at which the wiring board is sandwiched and held between an upper die and a lower die of a molding die when forming the sealing resin material in the molding area. The clamp area is arranged on the outer circumferential side of the molding area, and is formed in a frame shape along an outer circumferential portion of the wiring board.

To increase the rigidity of the wiring board and suppress the occurrence of warping, a solid pattern is provided on an outer circumferential side of the product formation sections on which a desired wiring pattern is formed. The solid pattern is formed by completely covering the relevant area with the material used to form the wiring. The solid pattern is formed so as to extend across the molding area and the clamp area of the wiring board.

However, when a solid pattern is formed so as to continuously cover, in other words, completely cover, one face of a wiring board, there is the disadvantage that warping occurs in the thickness direction of the wiring board due to a difference in the coefficients of thermal expansion between the material forming the solid pattern and the material forming the wiring board. Further, when a solid pattern is formed so as to completely cover one face of a wiring board, there is the disadvantage that the solid pattern peels off from the wiring board.

Therefore, to alleviate warping that occurs in the wiring board and suppress peeling of the solid pattern, the solid pattern is divided into a plurality of dots that are formed in a predetermined size, and the plurality of dots are arranged in a matrix form. Further, the dots comprising the solid pattern are formed in a predetermined size so that warping that occurs in the wiring board due to the solid pattern decreases to a certain extent.

Furthermore, in the clamp area, a gate area is provided at a position that corresponds to a gate of the molding die. The gate area is formed by completely covering the relevant area with the material used to form the wiring, and in order to ensure releasability with respect to the sealing resin material, an insulating film is removed from the gate area.

Recently, accompanying the miniaturization and thinning of portable electronic equipment, there has also been a demand for miniaturization and thinning of semiconductor devices that are mounted in such portable electronic equipment, and consequently wiring boards are also being made thinner. When the thickness of a wiring board is reduced to around 0.1 mm, the mechanical rigidity of the wiring board significantly decreases.

Consequently, in a process for molding a wiring board, as shown in FIG. 1, when an outer circumferential portion of a thin wiring board 101 is sandwiched and held across clamp area 113 between a set of upper die 121a and lower die 121b that comprise molding die 121, there is the problem that a portion of gate area 114 that is within clamp area 113 and that corresponds to gate 124 of molding die 121 is deformed by a force that pinches wiring board 101 of molding die 121.

When the portion of gate area 114 is deformed so as to bulge towards the side of cavity 122 of molding die 121 in this manner, there is a risk that sealing resin material 130 that is injected into the inside of molding die 121 will flow from one surface side of wiring board 101 to another surface side of wiring board 101 and leak out, and that sealing resin material 130 will cover a land that is formed on the rear surface side of wiring board 101. Consequently, it will not be possible to form solder balls on the land of the wiring board in a ball mounting process that is performed thereafter in the semiconductor device manufacturing process. There is thus the problem that defective semiconductor devices will be manufactured, and it will not be possible to mount the semiconductor devices on a mounting board.

SUMMARY

The present invention solves the above described problems.

According to one aspect of a wiring board of the present invention, the wiring board comprises: a product formation area in which are arranged a plurality of product formation sections onto which a semiconductor chip is mounted; a molding area that is provided on an outer circumferential side of the product formation area, and with which a seal portion that covers the semiconductor chips that are mounted on the product formation sections makes contact; a clamp area that is provided on an outer circumferential side of the molding area, and that is held by a molding die that forms the seal portion; wiring that is provided in the product formation area, and that is electrically connected to the semiconductor chips; a first solid pattern that is provided in the molding area, and in which a plurality of dots are arranged: and a second solid pattern that is provided in the clamp area, and in which a plurality of dots that are larger than the dots of the first solid pattern are arranged.

In the wiring board according to the present invention configured as described above, the rigidity of the clamp area of the wiring board is enhanced by providing therein the second solid pattern that comprises larger dots than the first solid pattern that is provided on the molding area. It is thus possible to prevent the occurrence of deformation in the clamp area of the wiring board when forming the seal portion in the molding area of the wiring board. As a result, when forming the seal portion in the molding area of the wiring board, it is possible to prevent the occurrence of molding defects due to the sealing resin material flowing from one surface side to the other surface side of the wiring board.

According to one aspect of a method of manufacturing a semiconductor device according to the present invention, the method uses a wiring board comprising: a product formation area in which are arranged a plurality of product formation sections onto which a semiconductor chip is mounted; a molding area that is provided on an outer circumferential side of the product formation area, and with which a seal portion that covers the semiconductor chips that are mounted in the product formation sections makes contact; a clamp area that is provided on an outer circumferential side of the molding area, and that is held by a molding die that forms the seal portion; wiring that is provided in the product formation area, and that is electrically connected to the semiconductor chips; a first solid pattern that is provided in the molding area, and in which a plurality of dots are arranged; and a second solid pattern that is provided in the clamp area, and in which a plurality of dots that are larger than the dots of the first solid pattern are arranged. The method of manufacturing a semiconductor device includes: mounting semiconductor chips on the product formation sections; and holding the clamp area of the wiring board that has the semiconductor chips mounted on the product formation sections in a molding die, and forming the seal portion so as to cover the molding area and the product formation area.

According to the present invention, because the wiring board comprises the second solid pattern that is provided in the clamp area, the rigidity of the clamp area of the wiring board is enhanced, and the occurrence of deformation in the wiring board can be prevented when the seal portion is formed.

BRIEF DESCRIPTION OF THE DRAWINGS

The above features and advantages of the present invention will become more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. Those skilled in the art recognize that many alternative embodiments can be accomplished using the teachings of the present invention and that the present invention is not limited to the embodiments illustrated for explanatory purposes.

Figure 1:
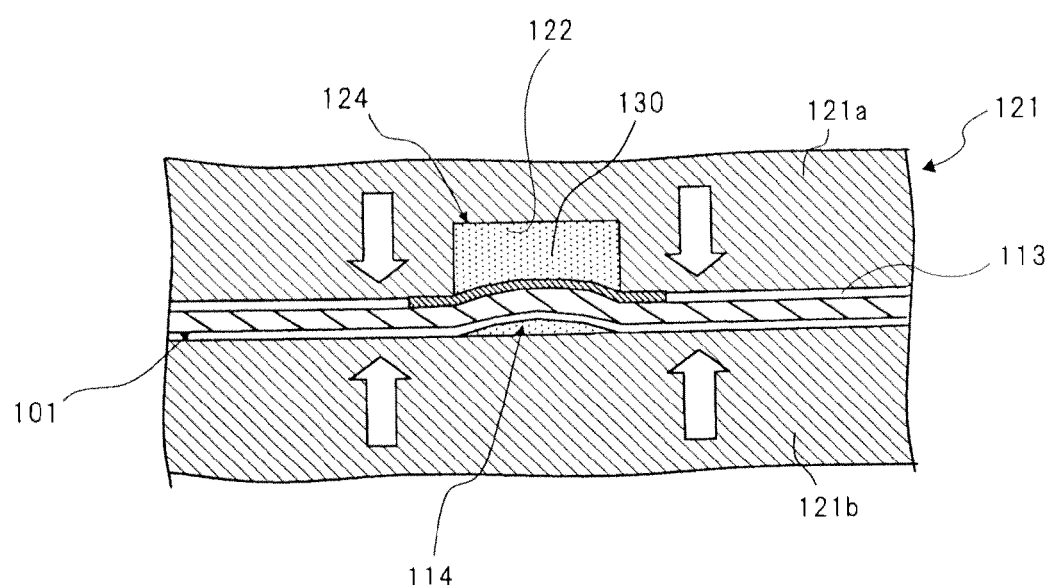
FIG. 1 is a sectional view that illustrates a molding process using a wiring board that relates to the present invention.
Figure 2:
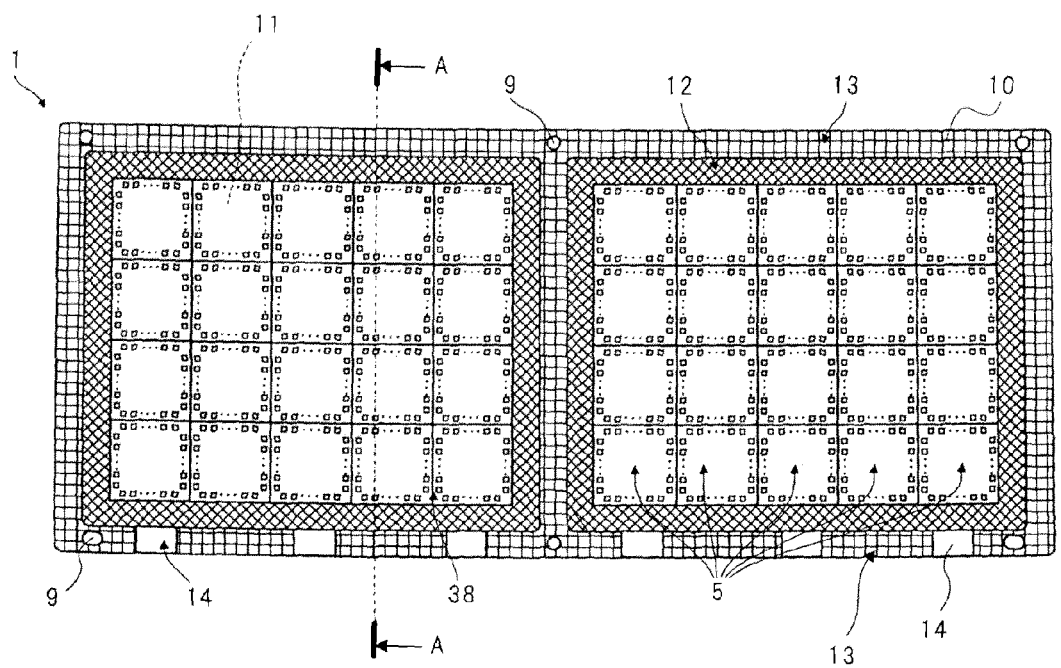
FIG. 2 is a plan view that illustrates a wiring board according to an exemplary embodiment.
Figure 3:
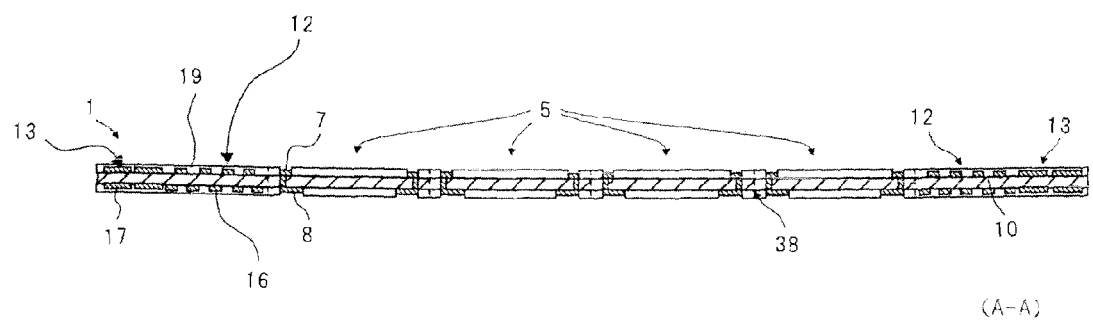
FIG. 3 is a sectional view that illustrates the wiring board according to the exemplary embodiment.
Figure 4:
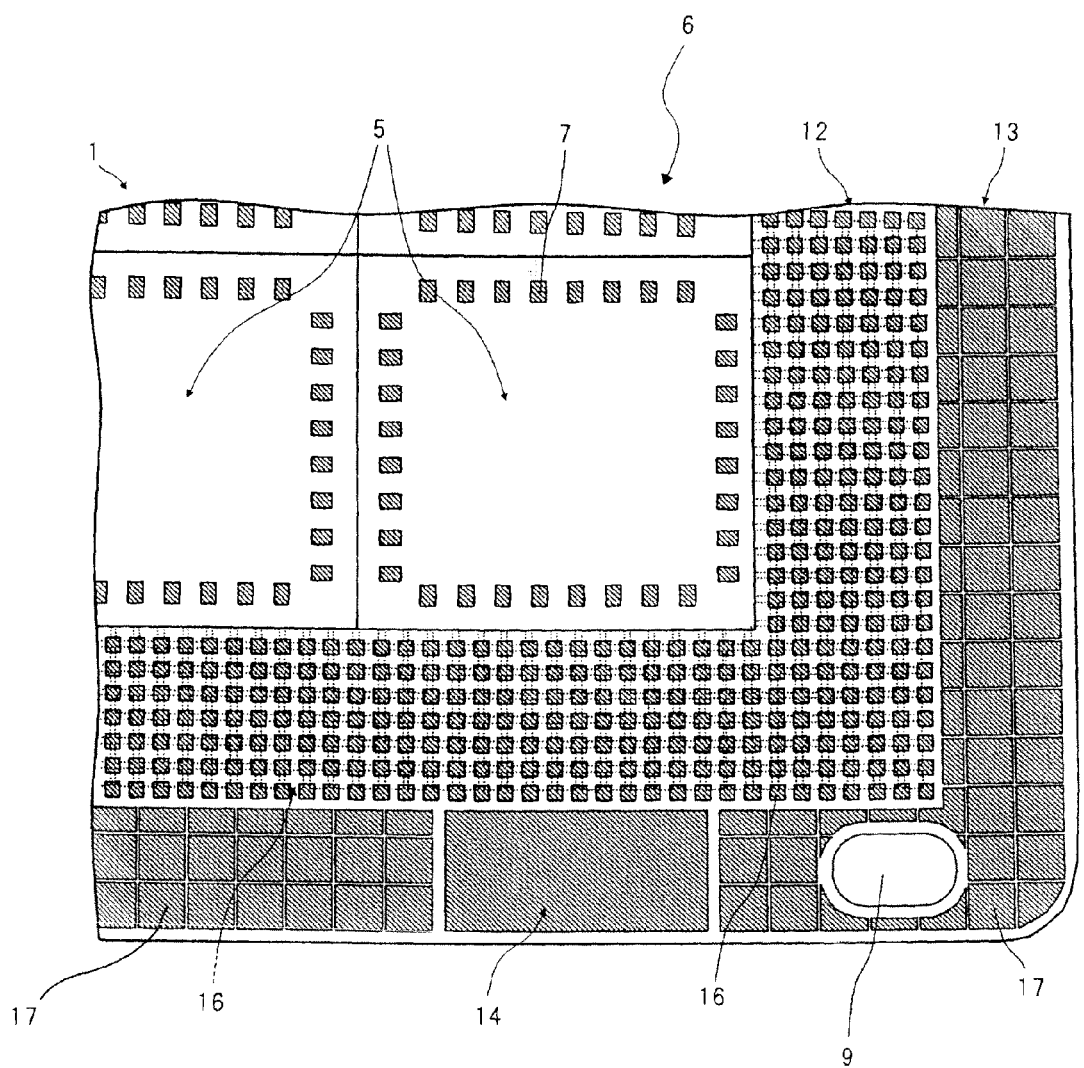
FIG. 4 is a plan view that illustrates a first and a second solid pattern included in the wiring board according to the exemplary embodiment.
Figure 5:
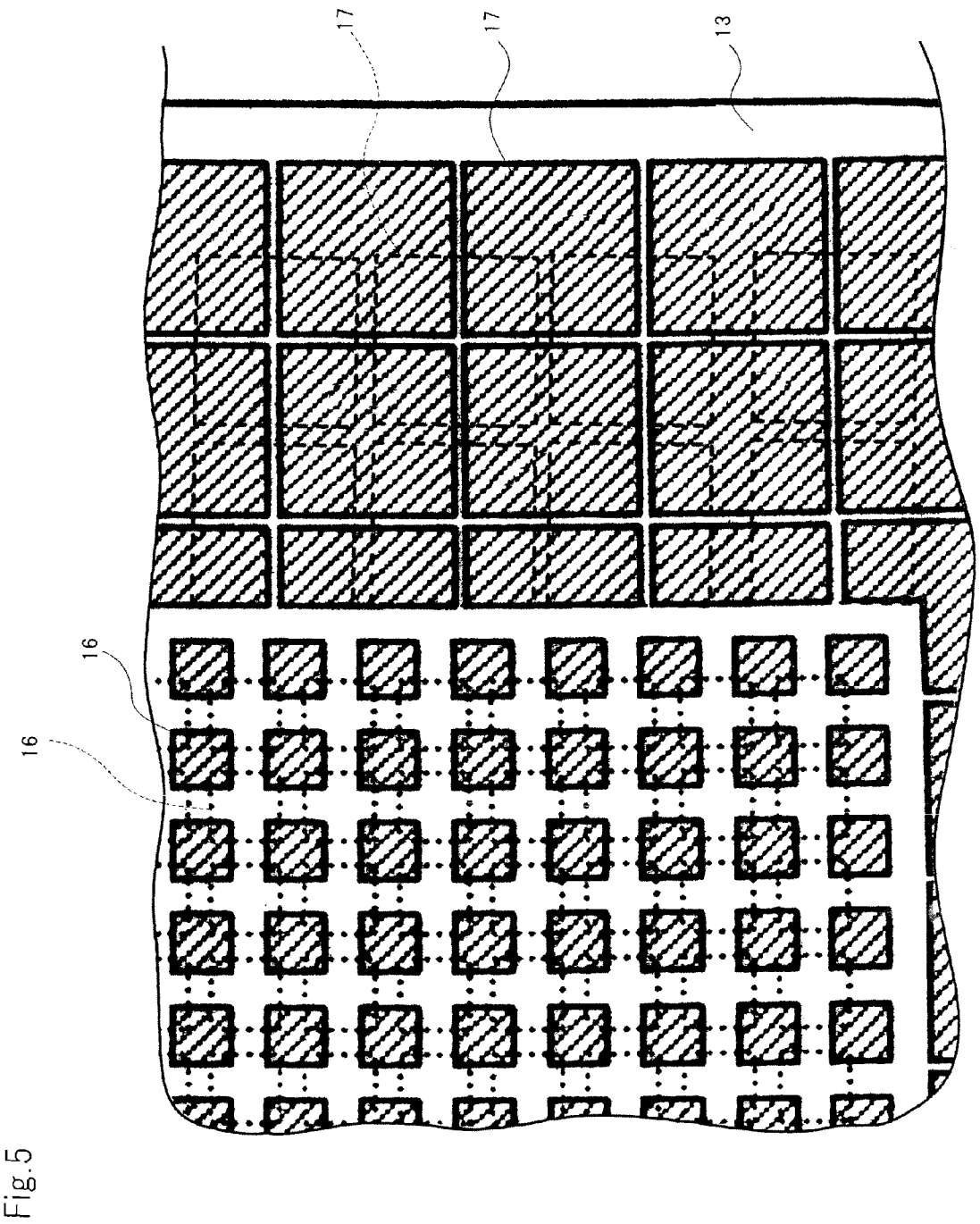
FIG. 5 is a plan view for describing the arrangement of dots comprising the first and second solid patterns according to the exemplary embodiment.

FIG. 2 shows a plan view of an outline configuration of a wiring board according to an exemplary embodiment. FIG. 3 shows a sectional view of the outline configuration of the wiring board according to the exemplary embodiment. FIG. 4 shows a plan view of the configurations of a first and a second solid pattern included in the wiring board according to the exemplary embodiment. FIG. 5 shows a plan view for describing the arrangement of dots comprising the first and second solid patterns according to the exemplary embodiment.

For example, a glass epoxy wiring board with a thickness of 0.1 mm is used as wiring board 1. As shown in FIG. 2, one surface of wiring board (board) 1 includes a plurality of product formation sections 5 that are arranged in a matrix form. Two product formation areas 6 that each comprise, for example, twenty product formation sections 5 that are arrayed in a 4×5 (length×width) arrangement are provided on wiring board 1. Further, a predetermined wiring pattern (not shown) is formed on each product formation section 5 of wiring board 1. The wiring formed by the wiring pattern is partially covered with an insulating film such as, for example, a solder resist.

As shown in FIG. 3 and FIG. 4, on one surface side of product formation sections 5, a plurality of connection pads 7 are formed at the positions of portions where wiring is exposed from the solder resist that covers the wiring. Further, as shown in FIG. 4, on the other surface side of product formation sections 5, a plurality of lands 8 are formed at the positions of portions where wiring is exposed from the solder resist that covers the wiring. Connection pads 7 and lands 8 that correspond to connection pads 7 are electrically connected, respectively, by wiring of wiring board 1.

Wiring board 1 also includes frame sections 10 that are provided around the respective product formation areas 6 in which the plurality of product formation sections 5 are arranged in a matrix form. Positioning holes 9 are provided at predetermined intervals in each frame section 10. These positioning holes 9 are utilized to enable transportation and positioning of wiring board 1 in the semiconductor device manufacturing process. Each frame section 10 of wiring board 1 includes frame-shaped molding area 12 that is arranged around the respective product formation area 6 and that the sealing resin material contacts together with product formation sections 5 in the molding process in which semiconductor chips 11 are covered with the sealing resin material. Each frame section 10 of wiring board 1 also includes frame-shaped clamp area 13 that is arranged on the outer circumferential side of molding area 12 and is formed along the outer circumferential portion of wiring board 1, and which is sandwiched and held between the molding die during the molding process.

Molding area 12 is provided all along the outer circumference of each product formation area 6. Clamp area 13 is provided all along the outer circumference of each molding area 12. Further, gate area 14 that corresponds to the gate of the molding die is provided in clamp area 13 of wiring board 1. Gate area 14 is formed by covering the relevant area completely with the material used to form the wiring.

Further, as shown in FIG. 4 and FIG. 5, first solid pattern 16 is formed on one surface side of molding area 12 of wiring board 1. First solid pattern 16 comprises, for example, a plurality of dots (unit patterns) of a size of approximately 0.3 mm×0.3 mm (length×width) that form a substantially square shape. The dots of first solid pattern 16 are arranged in a matrix form with an interval of 0.05 mm between each dot.

In this connection, since the solid pattern according to the present invention is comprised by a plurality of dots that are arranged with intervals between each dot, strictly speaking this pattern is a so-called "dot pattern" that is different to a "solid" state that is formed by completely covering an area without any intervals in the pattern. However, according to the present invention, for convenience the pattern is referred to as a "solid pattern".

First solid pattern 16 is also formed on the other surface side of molding area 12, in a similar manner to the one surface side. First solid pattern 16 that is formed on the other surface side of molding area 12 differs from first solid pattern 16 formed on the one surface side with respect to the arrangement of the dots only. The positions of the dots comprising first solid pattern 16 on the one surface side of wiring board 1 and the positions of the dots comprising first solid pattern 16 on the other surface side of wiring board 1 are out of alignment with each other with respect to two array directions that are orthogonal in the matrix form.

More specifically, as shown by dotted lines in FIG. 5, a center point of a single dot comprising first solid pattern 16 on the other surface side of molding area 12 is arranged so as to be positioned at the center of a quadrilateral that is formed by center points of four dots that are adjacent to each other that are disposed in a 2×2 (length×width) arrangement in first solid pattern 16 that is formed on the one surface side of molding area 12.

In addition, the four dots of first solid pattern 16 on the one surface side of wiring board 1 and the single dot of first solid pattern 16 on the other surface side of wiring board 1 are partially overlapping.

In other words, a single square-shaped dot of first solid pattern 16 on the other surface side of molding area 12 is disposed so as to extend over a corner of four square-shaped dots, respectively, that are disposed in a 2×2 (length×width) arrangement in first solid pattern 16 on one surface side of molding area 12.

According to an exemplary embodiment, first solid pattern 16 is formed on the top and bottom surfaces (front and rear faces) of molding area 12 that is a region in which wiring is not formed, in a manner in which the dots formed on first solid pattern 16 on one surface side are arranged so as to be out of alignment with dots formed on first solid pattern 16 on the other surface side. Hence, since a balance can be obtained with respect to rigidity between product formation sections 5 in which wiring is formed and molding area 12, it is possible to prevent warpage from occurring in the thickness direction of wiring board 1. Further, since the gap between each dot of first solid pattern 16 is small as a result of providing first solid pattern 16 that comprises dots of a quadrilateral shape such as a square shape, the rigidity of molding area 12 can be enhanced.

In addition, as shown in FIG. 3 and FIG. 4, according to wiring board 1 of the exemplary embodiment, second solid pattern 17 is provided in the clamp area of frame section 10. Second solid pattern 17 comprises dots of a size of, for example, approximately 1 mm×1 mm or more that are larger than the size of the dots of first solid pattern 16, and which are formed in, for example, a substantially square shape and arranged in a matrix form with an interval of 0.05 mm between each dot. By providing second solid pattern 17 that comprises dots that are larger than the dots of first solid pattern 16 in clamp area 13 of wiring board 1, the rigidity at the outer circumferential edge of wiring board 1 that is clamped when molding is carried out with respect to molding area 12 can be further enhanced.

Therefore, when clamping clamp area 13 of wiring board 1 in the molding process, deformation of wiring board 1 that occurs at gate area 14 can be decreased. Further, with respect to second solid pattern 17 also, similarly to first solid pattern 16, the positions of the dots of second solid pattern 17 on one surface side of wiring board 1 and the positions of the dots of second solid pattern 17 on the other surface side of wiring board 1 are arranged so as to be out of alignment with each other so that, as much as possible, the positions of gaps between the dots comprising the respective second solid patterns 17 do not overlap with respect to the front and rear surfaces of wiring board 1.

Similarly to the above description with respect to first solid pattern 16, with regard to second solid pattern 17 also, the dot positions of second solid pattern 17 on one surface side of wiring board 1 and the dot positions of second solid pattern 17 on the other surface side of wiring board 1 are out of alignment with each other with respect to two array directions that are orthogonal in the matrix form.

More specifically, as shown by dashed lines in FIG. 5, a center point of a single dot comprising second solid pattern 17 formed on the other surface side of clamp area 13 is arranged so as to be positioned at the center of a quadrilateral that is formed by center points of four dots that are adjacent to each other that are disposed in a 2×2 (length×width) arrangement in second solid pattern 17 that is formed on the one surface side of clamp area 13.

In addition, the four dots of second solid pattern 17 on the one surface side of wiring board 1 and the single dot of second solid pattern 17 on the other surface side of wiring board 1 are partially overlapping.

Further, although not shown in FIG. 4, as illustrated in FIG. 3, insulating film 19 such as, for example, a solder resist film, is formed on first and second solid patterns 16 and 17 that are formed in molding area 12 and clamp area 13. Note that the insulating film is eliminated from the portion of gate area 14 to ensure releasability so that removal of cull section 34 shown in FIG. 7C from wiring board 1 after molding can be easily performed.

In this connection, according to the present exemplary embodiment, for ensuring sufficient mechanical strength when transporting wiring board 1, a configuration is adopted in which second solid pattern 17 is formed on the entire clamp area 13 of the outer circumferential portion of wiring board 1. However, when the object is only to reduce the occurrence of deformation at the portion of gate area 14 of wiring board 1 in the molding process, a configuration may be adopted in which second solid pattern 17 is provided on only one side of the outer circumferential portion of wiring board 1, which is the side on which clamp area 13 having gate area 14 is arranged.

A method of manufacturing a semiconductor device that uses wiring board 1 configured as described above will now be described. FIGS. 6A to 6E show sectional views for describing the method of manufacturing a semiconductor device that uses wiring board 1 of the present exemplary embodiment. FIGS. 7A to 7D show sectional views that illustrate a molding process in the method of manufacturing a semiconductor device that uses wiring board 1 of the present exemplary embodiment. FIG. 8 shows a sectional view for describing a molding process using wiring board 1 of the present exemplary embodiment.

Figure 6A:
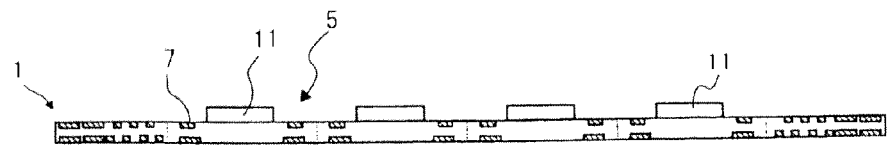
FIG. 6A to FIG. 6E are sectional views for describing a method of manufacturing a semiconductor device that uses the wiring board according to the exemplary embodiment.

First, as shown in FIG. 6A, wiring board 1 is transferred to a die bonding process, and semiconductor chip 11 is mounted in each product formation section 5.

In each semiconductor chip 11, for example, a logic circuit or a storage circuit or the like is formed on one face of an Si substrate, and a plurality of electrode pads (not shown) are formed at positions in the vicinity of the circumference thereof. Additionally, a passivation film (not shown) is formed on one side of semiconductor chip 11 on which the electrode pads are not formed, to thereby protect a circuit forming surface by means of the passivation film.

In the die bonding process, by using a die bonding apparatus that is not shown in the drawings, the other surface of each semiconductor chip 11 (surface opposite to the surface on which the electrode pads are formed) is adhered and fixed to a substantially center part of each product formation section 5 on the one surface side of wiring board 1 through an insulative adhesive agent, a DAF (Die Attached Film) or the like. After semiconductor chips 11 have been mounted on all product formation sections 5, wiring board 1 is transferred to a wire bonding process.

Figure 6B:
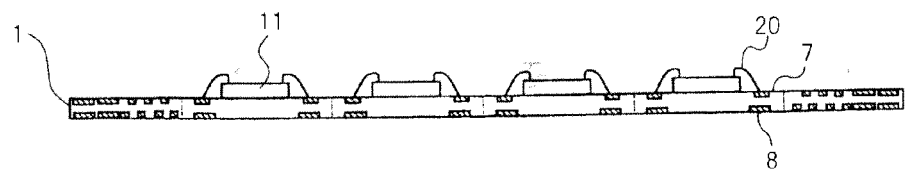

As shown in FIG. 6B, in the wire bonding process, the electrode pads formed on one surface of semiconductor chips 11 are electrically connected to connection pads 7 of product formation sections 5 corresponding to the electrode pads, through conductive wires 20. Wires 20 are made of, for example, Au, Cu or the like. Using an unshown wire bonding apparatus, one end of each wire 20 that has a ball formed thereon by melting is connected by ultrasonic thermo-compression bonding onto an electrode pad of semiconductor chip 11. Thereafter, wire 20 is extended so as to form a predetermined loop shape, and the other end of wire 20 is connected by ultrasonic thermo-compression bonding onto connection pad 7 corresponding to the electrode pad. After connection of wires 20 to all of product formation sections 5 is completed, wiring board 1 that is configured as shown in FIG. 6B is transferred to a molding process.

Next, the molding process of the method of manufacturing a semiconductor device according to the present exemplary embodiment is described.

Figure 7A:
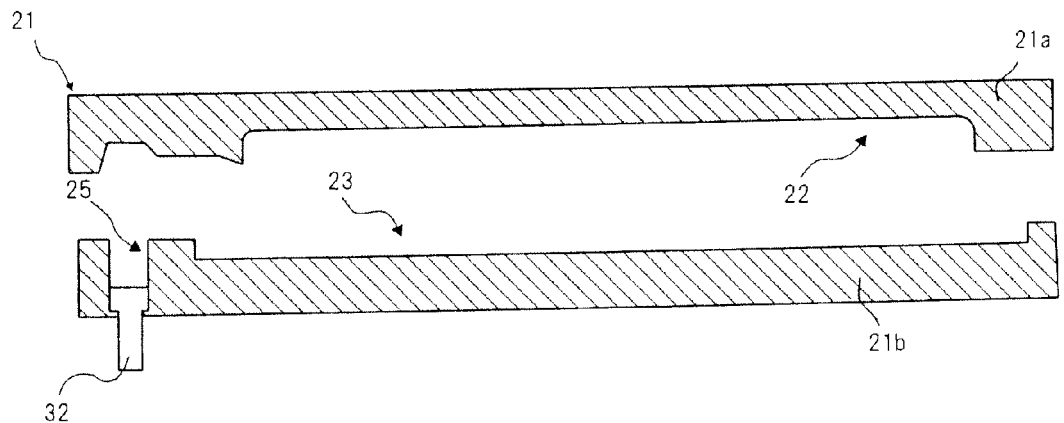
FIG. 7A to FIG. 7D are sectional views that illustrate a molding process in the method of manufacturing a semiconductor device that uses the wiring board according to the exemplary embodiment.
Figure 8:
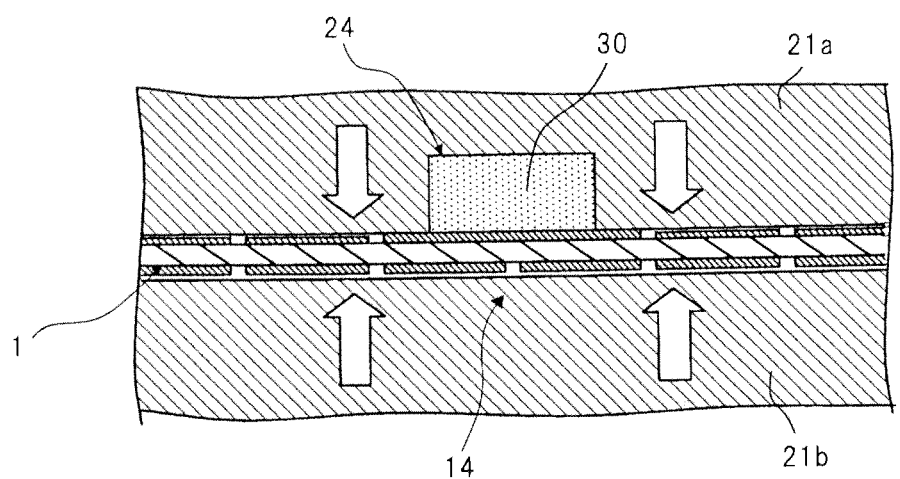
FIG. 8 is a sectional view for describing a molding process that uses the wiring board according to the exemplary embodiment.

FIG. 7A shows a sectional view of an outline configuration of a mold apparatus (transfer mold apparatus) as a molding die used in the molding process according to the present exemplary embodiment.

As shown in FIG. 7A, the mold apparatus has molding die 21 comprising a pair of upper die 21a and lower die 21b. Upper die 21a has cavity 22 into which a sealing resin material is filled, and lower die 21b has recess 23 into which wiring board 1 is placed. Further, gate 24 and pot 25 are formed in upper die 21a in communication with cavity 22. In addition, air vent 26 is formed at an end that faces an end on the side on which gate 24 is formed.

Figure 7B:
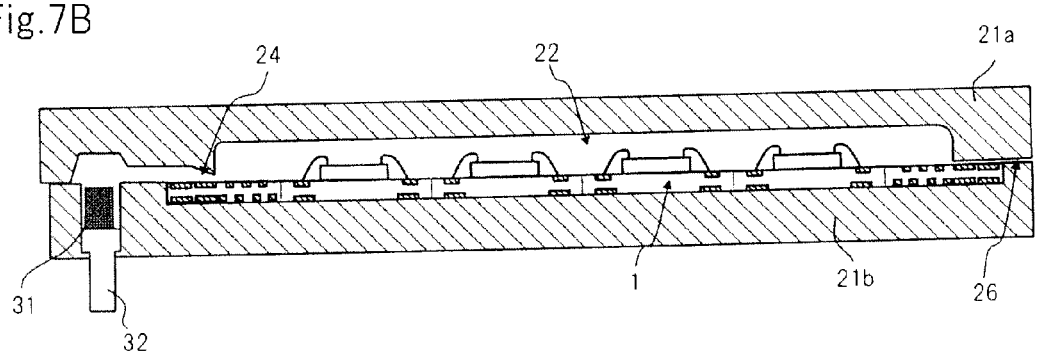

When the wire bonding process is completed, wiring board 1 is set inside recess 23 of lower die 21b, as shown in FIG. 7B. Molding die 21 is then clamped, and clamp area 13 of wiring board 1 is sandwiched and held between upper die 21a and lower die 21b. Subsequently, as shown in FIG. 8, sealing resin material 30 is supplied from gate 24 of molding die 21. As a result, seal portion 28 that straddles and covers product formation area 6 and molding area 12 of wiring board 1, and runner portion 29 are formed by sealing resin material 30.

According to the present exemplary embodiment, because second solid pattern 17 that comprises larger dots than first solid pattern 16, which is provided in molding area 12 of wiring board 1, is provided in clamp area 13, the rigidity of clamp area 13 is enhanced. Further, because the positions of the dots of first solid pattern 16 on one side of wiring board 1 are out of alignment with the positions of the dots of first solid pattern 16 on the other side of wiring board 1, the rigidity of molding area 12 is enhanced. Similarly, because the positions of the dots of second solid pattern 17 on one side of wiring board 1 are out of alignment with the positions of the dots of second solid pattern 17 on the other side of wiring board 1, the rigidity of clamp area 13 is further enhanced.

Further, according to the present exemplary embodiment, since the MAP method is used, cavity 22 is formed to a size that can collectively cover a plurality of product formation sections 5. In addition, according to the present exemplary embodiment, the cavity is divided into two areas. Thus, tablet (resist tablet) 31 is supplied into pot 25 of lower die 21b, and tablet 31 is melted by heating.

Figure 7C:
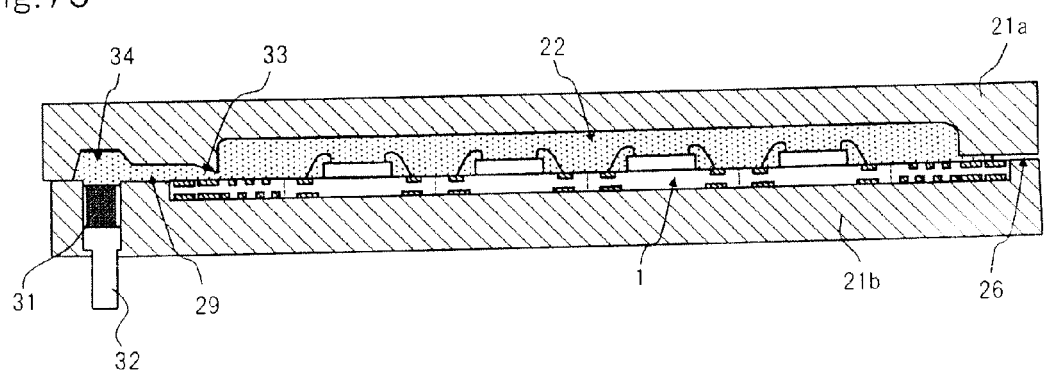

Subsequently, as shown in FIG. 7C, melted sealing resin material is injected into cavity 22 from gate 24 by plunger 32. After the sealing resin material is filled inside cavity 22, the sealing resin material is cured by heating at a predetermined temperature, for example, 180° C., to form seal portion 28.

Figure 7D:
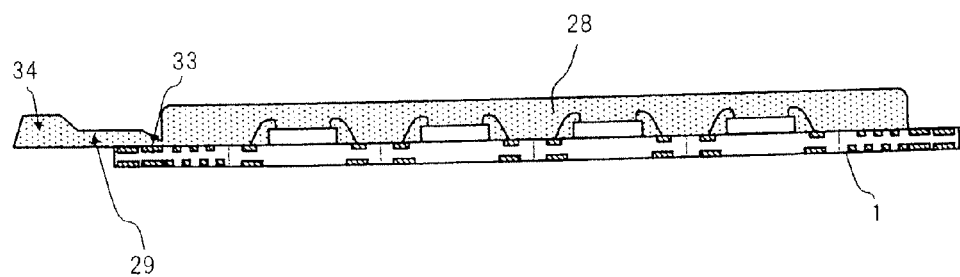

Thereafter, as shown in FIG. 7D, wiring board 1 is taken out from molding die 21 and reflowed at a predetermined temperature, for example, 240° C., to completely cure seal portion 28.

Figure 6C:
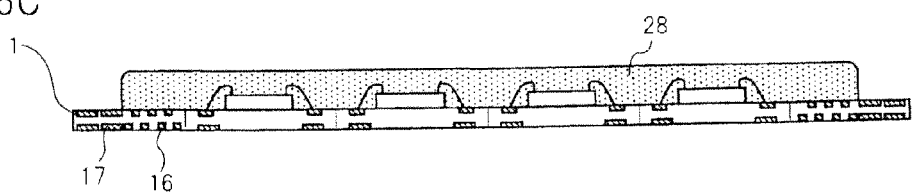

Thus, an intermediate structure of a semiconductor device in which seal portion 28 is formed on product formation sections 5 of wiring board 1 as shown in FIG. 6A and FIG. 6B is formed. Further, as shown in FIG. 6C, the sealing resin material that forms gate portion 33 that is connected to seal portion 28 of the intermediate structure, as well as runner portion 29 and cull section 34 is removed.

Figure 6D:
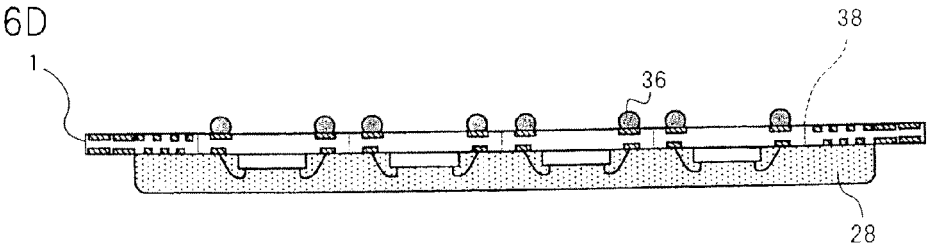

Next, wiring board 1 is transferred to a ball mounting process. As shown in FIG. 6D, conductive solder balls 36 are provided on a plurality of lands 8 arranged in a lattice shape on the other side of wiring board 1 to form bump electrodes which serve as external terminals.

The ball mounting process employs an unshown suction mechanism in which a plurality of suction holes are formed in correspondence with the positions of lands 8 on wiring board 1. For example, a plurality of solder balls 36 comprising solder or the like are retained in the respective suction holes, and the retained solder balls 36 are collectively placed onto all lands 8 of wiring board 1 through flux. After solder balls 36 are placed onto all product formation sections 5, wiring board 1 is reflowed to form bump electrodes (external terminals).

Finally, wiring board 1 having solder balls 36 placed thereon is transferred to a board dicing process.

Figure 6E:
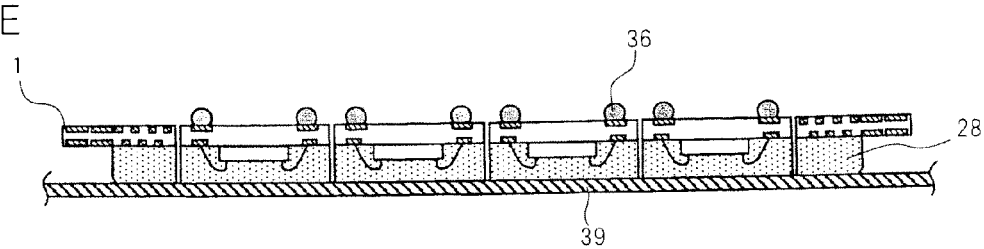

As shown in FIG. 6E, wiring board 1 is cut along dicing lines 38 (see FIG. 6D) to separate each product formation section 5. In the board dicing process, the side of seal portion 28 of wiring board 1 is adhered through an adhesive layer to dicing tape 39, to support wiring board 1 by means of dicing tape 39. Subsequently, wiring board 1 is cut vertically and horizontally along dicing lines 38 using a dicing blade of an unshown dicing apparatus, to separate wiring board 1 into respective product formation sections 5. After cutting and separation, product formation sections 5 are picked up from dicing tape 39 to thereby obtain semiconductor devices.

As described above, wiring board 1 of the present exemplary embodiment comprises: product formation area 6 in which a plurality of product formation sections 5 onto which semiconductor chip 11 is mounted are arranged; molding area 12 that is provided on an outer circumferential side of product formation area 6, and on which seal portion 28 that covers semiconductor chips 11 mounted on product formation sections 5 is formed; clamp area 13 that is provided on an outer circumferential side of molding area 12, and that is held by molding die 21 that forms seal portion 28; wiring that is provided in product formation area 6 and that is electrically connected to semiconductor chips 11; first solid pattern 16 that is provided in molding area 12, and in which a plurality of dots are arranged; and second solid pattern 17 that is provided in clamp area 13, and in which a plurality of dots that are larger than the dots of first solid pattern 16 are arranged.

Thus, because second solid pattern 17 that comprises larger dots than first solid pattern 16, which is provided in molding area 12 of wiring board 1, is provided in clamp area 13, it is possible to enhance the rigidity of clamp area 13 of wiring board 1. Therefore, the occurrence of deformation in the thickness direction of wiring board 1 in the molding process for forming seal portion 28 can be prevented.

Further, according to the present exemplary embodiment, clamp area 13 has gate area 14 that corresponds to gate 24 of molding die 21. Also, second solid pattern 17 is provided at a position adjacent to gate area 14. As a result, it is possible to prevent deformation occurring at gate area 14 of wiring board 1 at the time of clamping.

Furthermore, according to the present exemplary embodiment, first solid pattern 16 comprises a plurality of dots that are arranged in a matrix form. First solid pattern 16 is provided in molding area 12 on one surface side of wiring board 1 and in a region corresponding to molding area 12 on the other surface side of wiring board 1, respectively. The dots of first solid pattern 16 which is provided in molding area 12 on one surface side of wiring board 1, are substantially equal in size to the dots of first solid pattern 16 which is provided in a region corresponding to molding area 12 on the other surface side of wiring board 1. The positions of the dots of first solid pattern 16 on the one surface side of wiring board 1 and the positions of the dots of first solid pattern 16 on the other surface side of wiring board 1 are out of alignment with each other with respect to two array directions that are orthogonal in the matrix form. In other words, the centers of the dots of first solid pattern 16 on one surface side of wiring board 1 deviate from centers of dots of first solid pattern 16 on the other surface side of wiring board 1 in plan view, respectively. Thus, the rigidity of molding area 12 of wiring board 1 can be further enhanced.

Further, according to the present exemplary embodiment, second solid pattern 17 comprises a plurality of dots that are arranged in a matrix form. Second solid pattern 17 is provided in clamp area 13 on one surface side of wiring board 1 and in clamp area 13 on the other surface side of wiring board 1, respectively. The dots of second solid pattern 17 which is provided in clamp area 13 on one surface side of wiring board 1, are substantially equal in size to the dots of second solid pattern 17 which is provided in clamp area 13 on the other surface side of wiring board 1. The positions of the dots of second solid pattern 17 on the one surface side of wiring board 1 and the positions of the dots of second solid pattern 17 on the other surface side of wiring board 1 are out of alignment with each other with respect to two array directions that are orthogonal in the matrix form. In other words, the centers of the dots of second solid pattern 17 on one surface side of wiring board 1 deviate from centers of dots of second solid pattern 17 on the other surface side of wiring board 1 in plan view, respectively. Thus, the rigidity of clamp area 13 of wiring board 1 can be further enhanced.

In addition, according to the present exemplary embodiment, since first solid pattern 16 and second solid pattern 17 are covered by an insulating material (insulating film), the rigidity thereof is further enhanced.

Further, according to the present exemplary embodiment, since second solid pattern 17 is provided along the entire circumference of the outer circumferential portion of wiring board 1 with the exception of gate area 14, the rigidity of the entire outer circumferential portion of wiring board 1 can be enhanced.

Furthermore, according to the present exemplary embodiment, since first solid pattern 16 and second solid pattern 17 are formed with the same material as the wiring, first solid pattern 16 and second solid pattern 17 can be easily formed when forming the wiring pattern.

Although the invention made by the present inventors have been described in the foregoing based on an exemplary embodiment, the present invention is not limited to the above described exemplary embodiment, and naturally various changes are possible within a range that does not depart from the spirit and scope of the invention.

According to the present exemplary embodiment, an example has been described which uses solid patterns comprising dots of a substantially quadrilateral shape that are arranged in a matrix form, and it is sufficient that the size of a short side of the quadrilateral-shaped dots is 1 mm or more. Further, the dots comprising the solid patterns may be dots of another shape such as, for example, a circular shape.

Furthermore, according to the present exemplary embodiment, an example in which the present invention is used in a method of manufacturing a semiconductor device in which one semiconductor chip 11 is mounted in one product formation section 5 has been described. However, the present invention may also be applied to a method of manufacturing a MCP (Multi Chip Package) type semiconductor device in which a plurality of semiconductor chips are disposed in a layered arrangement in a single product formation section.

In addition, according to the present exemplary embodiment, a configuration has been described in which second solid pattern 17 is also arranged between two product formation areas 6. However, a configuration may also be adopted in which second solid pattern 17 is arranged only in clamp area 13 at the outer circumferential portion of wiring board 1.

The present invention also includes a wiring board having the form described hereunder.

A wiring board according to the present invention comprises: a product formation area in which a plurality of product formation sections onto which a semiconductor chip is mounted are arranged; a molding area that is provided all along an outer circumference of the product formation area, and with which a seal portion that covers the semiconductor chips mounted on the product formation sections makes contact; a clamp area that is provided all along an outer circumference of the molding area, and that is held by a molding die that forms the seal portion; a gate area that is provided in the clamp area, and that corresponds to a gate of the molding die; wiring that is provided in the product formation area, and that is electrically connected to the semiconductor chips; a first solid pattern that is provided in the molding area, and in which a plurality of dots are arranged in a matrix form; and a second solid pattern that is provided at a position that is adjacent to the gate area of the clamp area, and in which a plurality of dots that are larger than the dots of the first solid pattern are arranged in a matrix form.

In the wiring board according to the present invention, the first solid pattern has a plurality of dots that are arranged in a matrix form. The first solid pattern is provided in the molding area of one surface side of the wiring board, and in a region corresponding to the molding area on the other surface side of the wiring board, respectively. The positions of the dots of the first solid pattern on the one surface side of the wiring board and the positions of the dots of the first solid pattern on the other surface side of the wiring board are arranged to be out of alignment with each other so that the center point of a single dot of the first solid pattern on the other surface side of the wiring board is positioned at the center of a quadrilateral formed by center points of four dots that are adjacent to each other in the first solid pattern on the one surface side of the wiring board.

Further, in the wiring board according to the present invention, the second solid pattern has a plurality of dots that are arranged in a matrix form. The second solid pattern is provided in the clamp area on one surface side of the wiring board and in the clamp area on the other surface side of the wiring board, respectively. The positions of the dots of the second solid pattern on the one surface side of the wiring board and the positions of the dots of the second solid pattern on the other surface side of the wiring board are arranged to be out of alignment with each other so that the center point of a single dot of the second solid pattern on the other surface side of the wiring board is positioned at the center of a quadrilateral formed by center points of four dots that are adjacent to each other in the second solid pattern on the one surface side of the wiring board.

A wiring board, comprising:
   a plurality of product formation areas in which are arranged a plurality of product formation sections onto which a semiconductor chip is mounted;
   a frame-shaped molding area that is provided all along an outer circumference of said product formation areas, and with which a seal portion that covers said semiconductor chips that are mounted on said product formation sections makes contact;
   a clamp area that is provided all along an outer circumference of said molding area, and that is held by a molding die that forms said seal portion;
   a gate area that is provided in said clamp area, and that corresponds to a gate of the molding die;
   wiring that is provided in said product formation areas, and that is electrically connected to said semiconductor chips;
   a first solid pattern that is provided in said molding area, and which comprises a plurality of dots that are arranged in a matrix form; and
   a second solid pattern that is provided at a position that is adjacent to said gate area of said clamp area, and that comprises a plurality of dots that are arranged in a matrix form and that are larger than the dots of said first solid pattern.

In the wiring board according to the present invention, wherein
   said first solid pattern comprises the plurality of dots which are arranged in a matrix form;
   said first solid pattern is provided in said molding area on one surface side of said wiring board and in a region corresponding to said molding area that is on another surface side of said wiring board, respectively; and
   positions of dots of said first solid pattern on the one surface side of said wiring board and positions of dots of said first solid pattern on the other surface side of said wiring board are arranged to be out of alignment with each other so that a center point of a single dot of said first solid pattern on the other surface side of said wiring board is positioned at a center of a quadrilateral that is formed by center points of four dots that are adjacent to each other in said first solid pattern on the one surface side of said wiring board.

Further, in the wiring board according to the present invention, wherein:
   said second solid pattern comprises the plurality of dots which are arranged in a matrix form;
   said second solid pattern is provided in said clamp area on one surface side of said wiring board and in said clamp area on another surface side of said wiring board, respectively; and
   positions of dots of said second solid pattern on the one surface side of said wiring board and positions of dots of said second solid pattern on the other surface side of said wiring board are arranged to be out of alignment with each other so that a center point of a single dot of said second solid pattern on the other surface side of said wiring board is positioned at a center of a quadrilateral that is formed by center points of four dots that are adjacent to each other in said second solid pattern on the one surface side of said wiring board.

Further, in the wiring board according to the present invention, wherein the four dots of said first solid pattern on the one surface side of said wiring board and the single dot of said first solid pattern on the other surface side of said wiring board are partially overlapping.

Further, in the wiring board according to the present invention, wherein the four dots of said second solid pattern on the one surface side of said wiring board and the single dot of said second solid pattern on the other surface side of said wiring board are partially overlapping.

The present invention also includes a method of manufacturing a semiconductor device having the form described hereunder.

A method of manufacturing a semiconductor device, comprising:
   mounting semiconductor chips on product formation sections using a wiring board that comprises: a product formation area in which are arranged a plurality of said product formation sections onto which a semiconductor chip is mounted; a molding area that is provided on an outer circumferential side of said product formation area, and with which a seal portion that covers said semiconductor chips that are mounted on said product formation sections makes contact; a clamp area that is provided on an outer circumferential side of said molding area, and that is held by a molding die that forms said seal portion; wiring that is provided in said product formation area, and that is electrically connected to said semiconductor chips; a first solid pattern that is provided in said molding area, and in which a plurality of dots are arranged; and a second solid pattern that is provided in said clamp area, and in which a plurality of dots that are larger than the dots of said first solid pattern are arranged; and
   holding said clamp area of said wiring board in which said semiconductor chips are mounted on said product formation sections in a molding die, and forming said seal portion so as to cover said molding area and said product formation area.

Further, in the method of manufacturing a semiconductor device according to the present invention, wherein, in said wiring board:
   said clamp area includes a gate area that corresponds to a gate of the molding die; and
   said second solid pattern is provided at a position that is adjacent to said gate area.

Further, in the method of manufacturing a semiconductor device according to the present invention, wherein, in said wiring board:
   said first solid pattern comprises the plurality of dots which are arranged in a matrix form;
   said first solid pattern is provided in said molding area on one surface side of said wiring board and in a region corresponding to said molding area that is on another surface side of said wiring board, respectively; and positions of dots of said first solid pattern on the one surface side of said wiring board and positions of dots of said first solid pattern on the other surface side of said wiring board are out of alignment with each other in two array directions that are orthogonal in the matrix form, respectively.

Further, in the method of manufacturing a semiconductor device according to the present invention, wherein, in said wiring board:

said second solid pattern comprises the plurality of dots which are arranged in a matrix form;

said second solid pattern is provided in said clamp area on one surface side of said wiring board and in said clamp area on another surface side of said wiring board, respectively; and positions of dots of said second solid pattern on the one surface side of said wiring board and positions of dots of said second solid pattern on the other surface side of said wiring board are out of alignment with each other in two array directions that are orthogonal in the matrix form, respectively.

Further, in the method of manufacturing a semiconductor device according to the present invention, wherein, in said wiring board:

said first solid pattern comprises the plurality of dots which are arranged in a matrix form;

said first solid pattern is provided in said molding area on one surface side of said wiring board and in a region corresponding to said molding area that is on another surface side of said wiring board, respectively; and positions of dots of said first solid pattern on the one surface side of said wiring board and positions of dots of said first solid pattern on the other surface side of said wiring board are arranged to be out of alignment with each other so that a center point of a single dot of said first solid pattern on the other surface side of said wiring board is positioned at a center of a quadrilateral that is formed by center points of four dots that are adjacent to each other in said first solid pattern on the one surface side of said wiring board.

Further, in the method of manufacturing a semiconductor device according to the present invention, wherein, in said wiring board:

said second solid pattern comprises the plurality of dots which are arranged in a matrix form;

said second solid pattern is provided in said clamp area on one surface side of said wiring board and in said clamp area on another surface side of said wiring board, respectively; and positions of dots of said second solid pattern on the one surface side of said wiring board and positions of dots of said second solid pattern on the other surface side of said wiring board are arranged to be out of alignment with each other so that a center point of a single dot of said second solid pattern on the other surface side of said wiring board is positioned at a center of a quadrilateral that is formed by center points of four dots that are adjacent to each other in said second solid pattern on the one surface side of said wiring board.

Further, in the method of manufacturing a semiconductor device according to the present invention, wherein the four dots of said first solid pattern on the one surface side of said wiring board and the single dot of said first solid pattern on the other surface side of said wiring board are partially overlapping.

Further, in the method of manufacturing a semiconductor device according to the present invention, wherein the four dots of said second solid pattern on the one surface side of said wiring board and the single dot of said second solid pattern on the other surface side of said wiring board are partially overlapping.

It is apparent that the present invention is not limited to the above embodiments, but may be modified and changed without departing from the scope and spirit of the present invention.

What is claimed is:

1. A wiring board, comprising:

a product formation area in which are arranged a plurality of product formation sections onto which a semiconductor chip is mounted;

a molding area that is provided on an outer circumferential side of said product formation area, and which a seal portion that covers said semiconductor chips that are mounted on said product formation sections makes contact;

a clamp area that is provided on an outer circumferential side of said molding area, and that is held by a molding die that forms said seal portion, said clamp area including a gate area corresponding to a gate of the molding die;

wiring that is provided in said product formation area, and that is electrically connected to said semiconductor chips;

a first solid pattern that is provided in said molding area, and in which a plurality of dots are arranged; and a second solid pattern that is provided in said clamp area, and in which a plurality of dots that are larger than the dots of said first solid pattern are arranged, said second solid pattern being provided at a position that is adjacent to said gate area.

2. The wiring board according to claim 1, wherein:

said first solid pattern comprises the plurality of dots which are arranged in a matrix form;

said first solid pattern is provided in said molding area on one surface side of said wiring board and in a region corresponding to said molding area that is on another surface side of said wiring board, respectively; and positions of dots of said first solid pattern on the one surface side of said wiring board and positions of dots of said first solid pattern on the other surface side of said wiring board are out of alignment with each other in two array directions that are orthogonal in the matrix form, respectively.

3. The wiring board according to claim 1, wherein:

said second solid pattern comprises the plurality of dots which are arranged in a matrix form;

said second solid pattern is provided in said clamp area on one surface side of said wiring board and in said clamp area on another surface side of said wiring board, respectively; and positions of dots of said second solid pattern on the one surface side of said wiring board and positions of dots of said second solid pattern on the other surface side of said wiring board are out of alignment with each other in two array directions that are orthogonal in the matrix form, respectively.

4. The wiring board according to claim 1, wherein said first solid pattern and said second solid pattern are covered by an insulating material.

5. The wiring board according to claim 1, wherein said second solid pattern is provided along an entire circumference of an outer circumferential portion of said wiring board, excluding said gate area.

6. The wiring board according to claim 1, wherein said first solid pattern and said second solid pattern are formed from a material identical to a material forming said wiring.

7. A wiring board comprising:
    a board including a top surface, the top surface including a product formation area, a molding area that surrounds the product formation area and a peripheral area that surrounds the molding area, the peripheral area including a clamp area to be clamped by molding die and a gate area differing from the clamp area, said gate area corresponding to a gate of the molding die;
    a first solid pattern provided on the molding area of the board, the first solid pattern comprising a plurality of first dots; and
    a second solid pattern provided on the clamp area of the board at a position that is adjacent to said gate area, the second solid pattern comprising a plurality of second dots, and at least one of the second dots is larger in size than each of the first dots.

8. The wiring board according to claim 7, wherein the board includes a bottom surface opposed to the top surface, and the wiring board further comprising:
    a third solid pattern provided on a region of the bottom surface that corresponds to the molding area, the third solid pattern comprising a plurality of third dots, the third dots being substantially equal in size to the first dots; and
    a fourth solid pattern provided on a region corresponds to the clamp area that is on the bottom surface, the fourth solid pattern comprising a plurality of fourth dots, the fourth dots being substantially equal in size to the second dots.

9. The wiring board according to claim 8, wherein centers of the first dots of the top surface deviate from centers of the third dots of the bottom surface in plan view, respectively, and
    centers of the second dots of the top surface deviate from centers of the fourth dots of the bottom surface in plan view, respectively.

10. The wiring board according to claim 9, wherein the centers of the first dots deviate from the centers of the third dots so that a center of at least one of the first dots is positioned adjacent a center of an area defined by four centers of adjacent four dots which are included in the third dots, and
    the centers of the second dots are deviated from the centers of the fourth dots so that a center of at least one of the second dots is positioned adjacent a center of an area defined by adjacent four dots which are included in the fourth dots.

11. The wiring board according to claim 7, wherein the first dots each have substantially the same size, the first dots being arranged in a matrix, and
    the second dots each have substantially the same size, the second dots being arranged in a matrix.

12. The wiring board according to claim 7, further comprising:
    an insulating layer selectively provided on the top surface of the board to cover the first solid pattern and the second solid pattern except for the gate area.

13. The wiring board according to claim 7, further comprising:
    a wiring provided on the product formation area of the top surface, the wiring and the first and second solid patterns being formed by the same material.

14. A wiring board comprising:
    a board including a product formation area and a frame section that surrounds the product formation area, the frame section including a top surface, a bottom surface opposed to the top surface, and a gate area;
    a plurality of upper unit patterns provided on the top surface of the frame section; and
    a plurality of lower unit patterns provided on the bottom surface of the frame section so that a center of at least one lower unit pattern of the lower unit patterns deviates from a center of an upper unit pattern that overlaps the one lower unit pattern of the upper unit patterns in plan view, respectively,
    wherein said plurality of upper unit patterns is provided at a position that is adjacent to said gate area;
    wherein the to surface of the frame portion includes a molding area that surrounds the product formation area and a clamp area that surrounds the molding area,
    the plurality of upper unit patterns includes a plurality of first upper unit patterns arranged on the molding area and a plurality of second upper unit patterns arranged on the clamp area, at least one of the second upper unit patterns being larger in size than each of the first upper unit patterns, and
    the plurality of lower unit patterns includes a plurality of first lower unit patterns arranged on a region corresponding to the molding area that is on the bottom surface and a plurality of second lower unit patterns arranged on a region corresponding to the clamp area that is on the bottom surface, at least one of the second lower unit patterns being larger in size than each of the first lower unit patterns.

15. The wiring board according to claim 14, wherein at least one of centers of the lower unit patterns is positioned near a center of an area defined by four centers of adjacent four upper unit patterns of the upper unit patterns.

16. The wiring board according to claim 14, wherein the plurality of upper unit patterns are arranged in a matrix, and the plurality of lower unit patterns are arranged in a matrix.

17. The wiring board according to claim 14, further comprising:
    an insulating layer selectively provided on the first surface of the board to cover the upper unit patterns except for said gate area provided on the frame section.

18. The wiring board according to claim 14, further comprising:
    a wiring pattern provided on the product formation area of the board, wherein the wiring pattern and the upper and lower unit patterns are formed by the same material.

* * * * *